US008667448B1

(12) United States Patent  
Chou et al.

(10) Patent No.: US 8,667,448 B1  
(45) Date of Patent: Mar. 4, 2014

(54) INTEGRATED CIRCUIT HAVING LOCAL MAXIMUM OPERATING VOLTAGE

(71) Applicant: International Business Machines Corporation, Armonk, NY (US)

(72) Inventors: Anthony I. Chou, Beacon, NY (US); Arvind Kumar, Beacon, NY (US); Renee T. Mo, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/688,595

(22) Filed: Nov. 29, 2012

(51) Int. Cl.  
*G06F 9/455* (2006.01)  
*G06F 17/50* (2006.01)

(52) U.S. Cl.  
USPC ............ 716/132; 716/106; 716/108; 716/110; 716/133; 716/134

(58) Field of Classification Search  
USPC ................... 716/106–115, 132–136  
See application file for complete search history.

(56) References Cited

U.S. PATENT DOCUMENTS

| | | | |
|---|---|---|---|
| 7,155,359 B1 | 12/2006 | Kim et al. | |
| 7,205,165 B1 * | 4/2007 | Salman et al. | 438/10 |
| 7,439,538 B2 | 10/2008 | Shi et al. | |
| 7,454,316 B2 * | 11/2008 | Bose et al. | 702/186 |
| 7,573,285 B2 | 8/2009 | Zhao et al. | |
| 7,851,793 B2 | 12/2010 | Wang et al. | |
| 7,890,891 B2 * | 2/2011 | Stuber et al. | 716/102 |
| 8,022,716 B2 | 9/2011 | Yiang et al. | |
| 8,161,431 B2 * | 4/2012 | Buonpane et al. | 716/100 |
| 2003/0011395 A1 * | 1/2003 | Kim | 324/765 |
| 2006/0080062 A1 * | 4/2006 | Bose et al. | 702/186 |
| 2008/0038851 A1 * | 2/2008 | Koyama et al. | 438/17 |
| 2008/0122500 A1 * | 5/2008 | Suzuki | 327/143 |
| 2009/0048808 A1 * | 2/2009 | Bose et al. | 702/186 |
| 2009/0106712 A1 * | 4/2009 | Bickford et al. | 716/4 |
| 2010/0115475 A1 * | 5/2010 | Buonpane et al. | 716/2 |
| 2010/0308905 A1 * | 12/2010 | Mizushino et al. | 327/566 |
| 2011/0018565 A1 * | 1/2011 | Yiang et al. | 324/754.03 |
| 2011/0090015 A1 | 4/2011 | Sumita et al. | |
| 2011/0181315 A1 * | 7/2011 | Krishnan | 324/762.01 |
| 2012/0025862 A1 | 2/2012 | Chumakov et al. | |
| 2012/0181615 A1 | 7/2012 | Shimizu et al. | |
| 2012/0231623 A1 * | 9/2012 | Oshida et al. | 438/626 |
| 2013/0103351 A1 * | 4/2013 | Huang et al. | 702/182 |

* cited by examiner

*Primary Examiner* — Nha Nguyen  
(74) *Attorney, Agent, or Firm* — Cantor Colburn LLP; Ian MacKinnon

(57) ABSTRACT

Embodiments include a method for providing a local maximum operating voltage on an integrated circuit. The method includes determining a gate-to-contact reliability for each of the plurality of regions and calculating a local maximum voltage for each of the plurality of regions based on the gate-to-contact reliability. Based on a determination that the local maximum voltage in one of the plurality of regions is greater than a maximum voltage, the method includes setting the local maximum operating voltage to the maximum voltage. Based on a determination that the local maximum voltage in one of the plurality of regions is less than the maximum voltage, the method includes setting the local maximum operating voltage to the local maximum voltage.

13 Claims, 11 Drawing Sheets

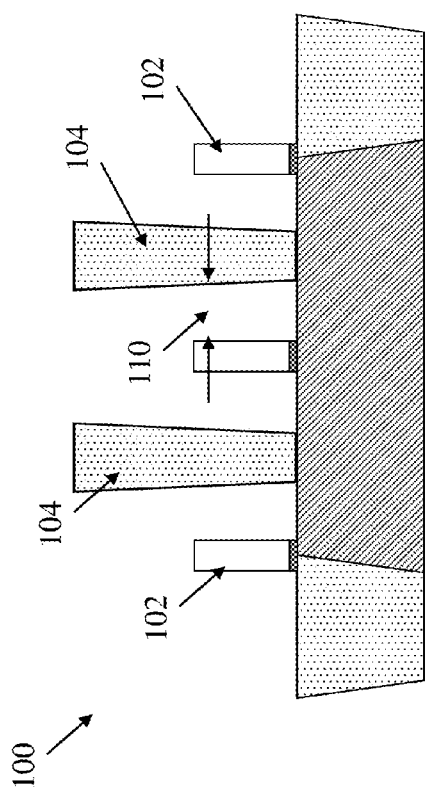
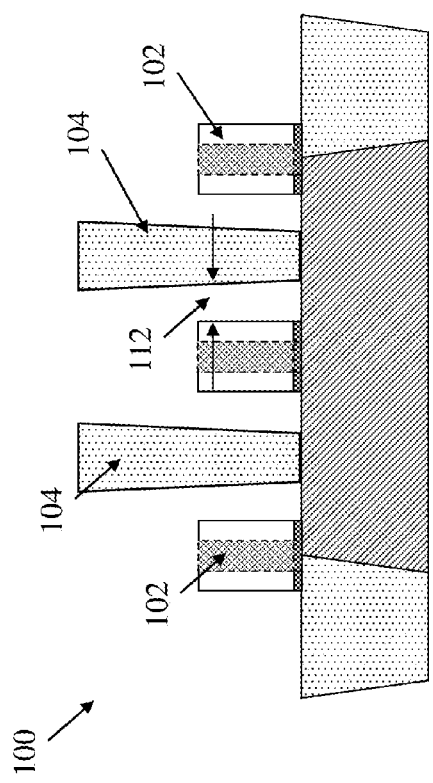
FIG. 1A
FIG. 1B

US 8,667,448 B1

INTEGRATED CIRCUIT HAVING LOCAL MAXIMUM OPERATING VOLTAGE

BACKGROUND

The present invention relates to integrated circuits (IC), and more specifically, to integrated circuits having local maximum operating voltages to prevent gate-to-contact time-dependent dielectric breakdown (TDDB) failure.

As integrated circuits continue to be made smaller, the gate-to-contact spacing continues to decrease. While the gate-to-contact spacing has been decreasing, the operating voltage has remained fairly constant. Many currently available ICs have multiple voltage zones and employ dynamic voltage scaling to adapt to variations in workload (e.g., higher supply voltage for peak load).

TDDB failure between gates and contacts in MOSFETs has become an important reliability concern in ICs. Gate-to-contact TDDB failure occurs when the dielectric or insulator between the gate and the contact breaks down due to extended application of electric field which causes the formation of a conducting path between the gate and the contact. The likelihood of a gate-to-contact TDDB failure in a MOSFET is a function of the dimensions of the gate, the dimensions of the contact, the gate-to-contact overlay, the dielectric material between gate and contact, and the MOSFET usage including voltage, temperature and time. Due to variances in the fabrication process, the dimensions of the gate, contact and gate-to-contact overlay can vary from wafer-to-wafer, across a wafer and across the chips of a wafer. This variability of the gate-to-contact spacing across the IC affects the reliability of the IC by creating regions in the chip which will experience TDDB failure at different operating voltages.

SUMMARY

Embodiments include a method for providing a local maximum operating voltage on an integrated circuit. The method includes determining a gate-to-contact reliability for each of the plurality of regions and calculating a local maximum voltage for each of the plurality of regions based on the gate-to-contact reliability. Based on a determination that the local maximum voltage in one of the plurality of regions is greater than a maximum voltage, the method includes setting the local maximum operating voltage to the maximum voltage. Based on a determination that the local maximum voltage in one of the plurality of regions is less than the maximum voltage, the method includes setting the local maximum operating voltage to the local maximum voltage.

Embodiments include a system for providing a local maximum operating voltage, the system includes an integrated circuit having a plurality of regions and a plurality of gate-to-contact reliability monitors disposed in each of the plurality of regions. The system also includes a supply voltage select controller configured to receive an operational characteristic from each of the of plurality of gate-to-contact reliability monitors, determine a gate-to-contact reliability for each of the plurality of regions based on the operational characteristic, and calculate a local maximum voltage for each of the plurality of regions based on the gate-to-contact reliability. Based on a determination that the local maximum voltage in one of the plurality of regions is greater than a maximum voltage, the supply voltage select controller sets the local maximum operating voltage to the maximum voltage. Based on a determination that the local maximum voltage in one of the plurality of regions is less than the maximum voltage, the supply voltage select controller sets the local maximum operating voltage to the local maximum voltage.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1A is a cross section of a MOSFET in accordance with an embodiment;

FIG. 1B is a cross section of a MOSFET in accordance with an embodiment;

DETAILED DESCRIPTION

Figure 1C:
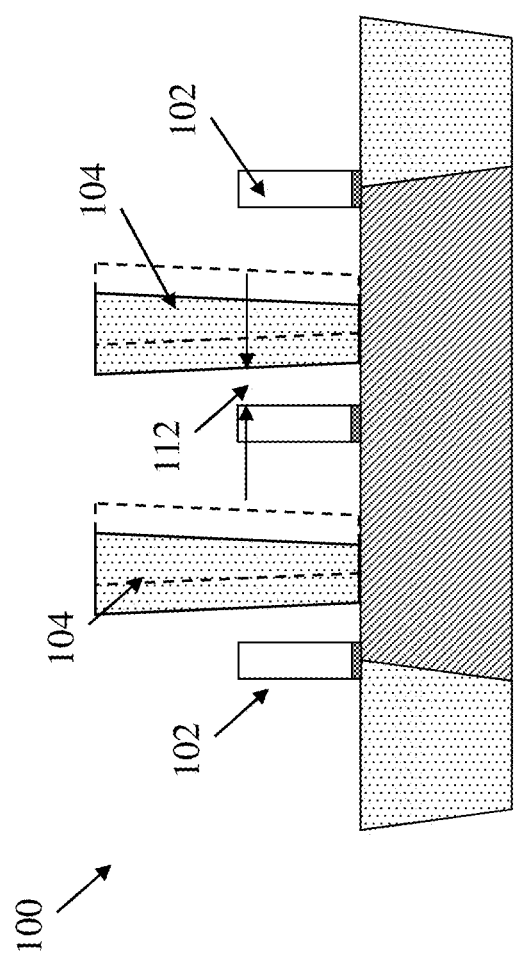
FIG. 1C is a cross section of a MOSFET in accordance with an embodiment.

Referring now to FIG. 1A, a cross section of a MOSFET 100 in accordance with an embodiment is illustrated. As shown the MOSFET 100 includes one or more gates 102 and one or more contacts 104 which are separated by a gate-to-contact distance 110. As shown in FIG. 1B, the width and location of the gate 102 are subject to variance which can cause the gate-to-contact distance 110 to decrease to a reduced gate-to-contact distance 112. Furthermore, as shown in FIG. 1C, the width and location of the contacts 104 are subject to variance which can cause the gate-to-contact distance 110 to decrease to a reduced gate-to-contact distance 112. Although illustrated separately, it will be understood by those of ordinary skill in the art that the widths and locations of the gates 102 and contacts 104 are both variable and can both combine to introduce variance on the gate-to-contact distance 110.

Figure 2A:
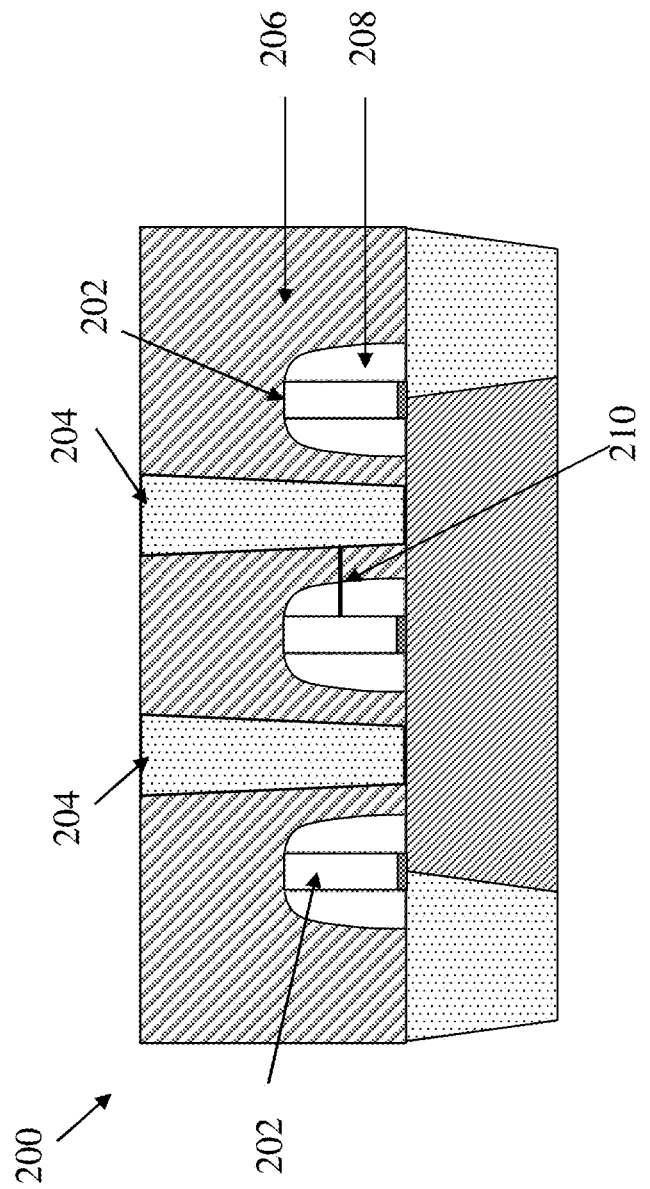
FIG. 2A is a cross section of a MOSFET in accordance with an embodiment.
Figure 2B:
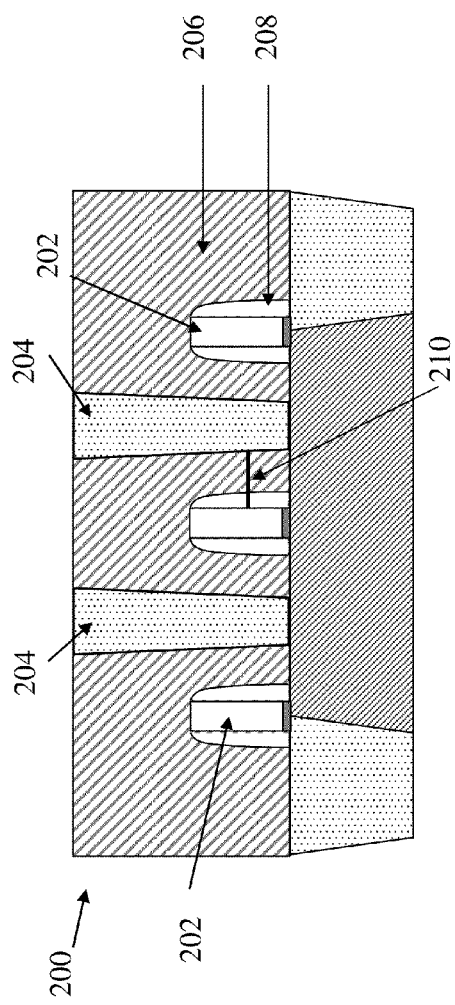
FIG. 2B is a cross section of a MOSFET in accordance with an embodiment.
Figure 2C:
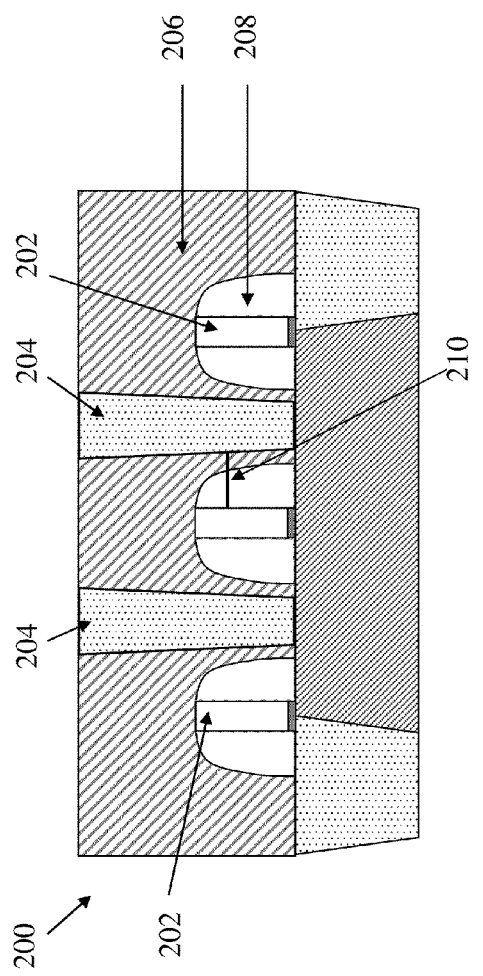
FIG. 2C is a cross section of a MOSFET in accordance with an embodiment.

Referring now to FIG. 2A, a cross section of a MOSFET 200 in accordance with an embodiment is illustrated. As shown the MOSFET 200 includes one or more gates 202 and one or more contacts 204 which are separated by a gate-to-contact distance 210. The MOSFET 200 also includes an interlayer dielectric 206 and a sidewall spacer 208, which may have different dielectric constants, disposed between the gates 202 and the contacts 204. As shown in FIGS. 2B and 2C, the thickness of the interlayer dielectric 206 and the sidewall spacer 208 are subject to variance.

In exemplary embodiments, the gate-to-contact spacing, as illustrated in FIGS. 1A, 1B, and 1C, and the variance in the thickness of the interlayer dielectric and the sidewall spacer, as illustrated in FIGS. 2A, 2B, and 2C, can vary across an IC. This variance causes different regions of the IC to experience gate-to-contact TDDB failure at different operating voltages. In exemplary embodiments, a plurality of gate-to-contact reliability monitors are disposed across the IC to measure the local variation. In one embodiment, the gate-to-contact reliability monitor may be a gate-to-contact chain structure configured to measure leakage, which is a function of gate-to-contact spacing. In another embodiment, the gate-to-contact reliability monitor may be configured to measure breakdown voltage, which is also function of gate-to-contact spacing. In other exemplary embodiments, a variety of known gate-to-contact reliability monitors may also be used.

Figure 3B:
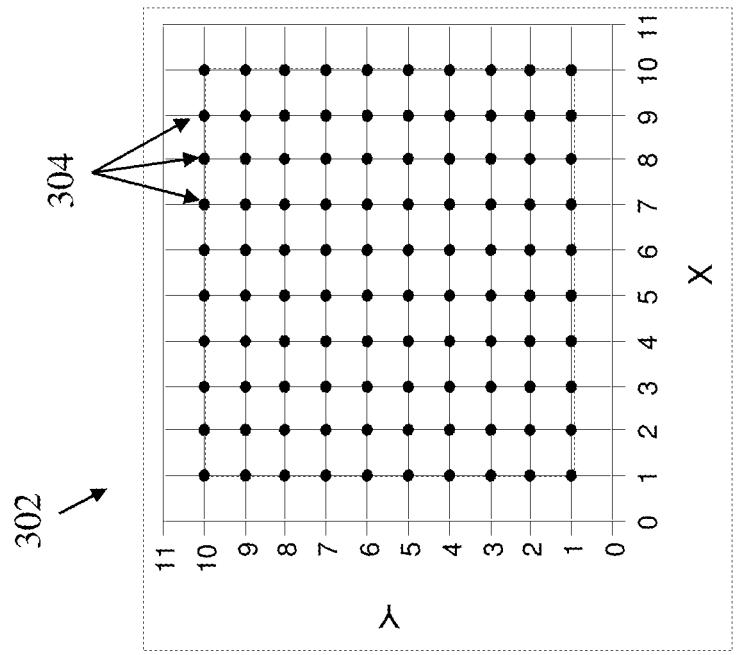
FIG. 3B is a block diagram of a integrated circuit chip having a plurality of gate-to-contact reliability monitors in accordance with an embodiment.
Figure 3A:
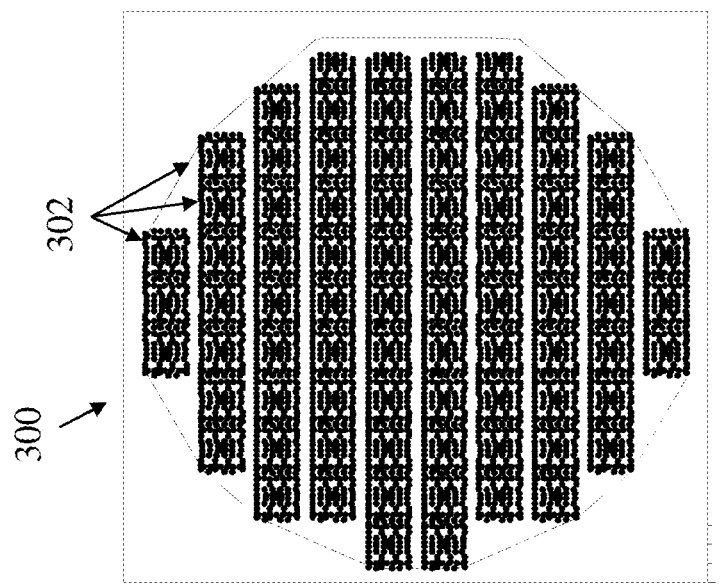
FIG. 3A is a block diagram of a integrated circuit wafer in accordance with an embodiment.

Referring now to FIG. 3A, a block diagram of an integrated circuit wafer 300 in accordance with an embodiment is shown. As illustrated, the integrated circuit wafer 300 includes a plurality of IC chips 302. FIG. 3B is a block diagram of an IC chip 302 having a plurality of gate-to-contact reliability monitors 304 in accordance with an embodiment. As illustrated, in one embodiment, a plurality of gate-to-contact reliability monitors 304 may be uniformly disposed across the IC chip 302. In another embodiment, the plurality of gate-to-contact reliability monitors 304 may be randomly disposed across the IC chip 302.

Figure 4:
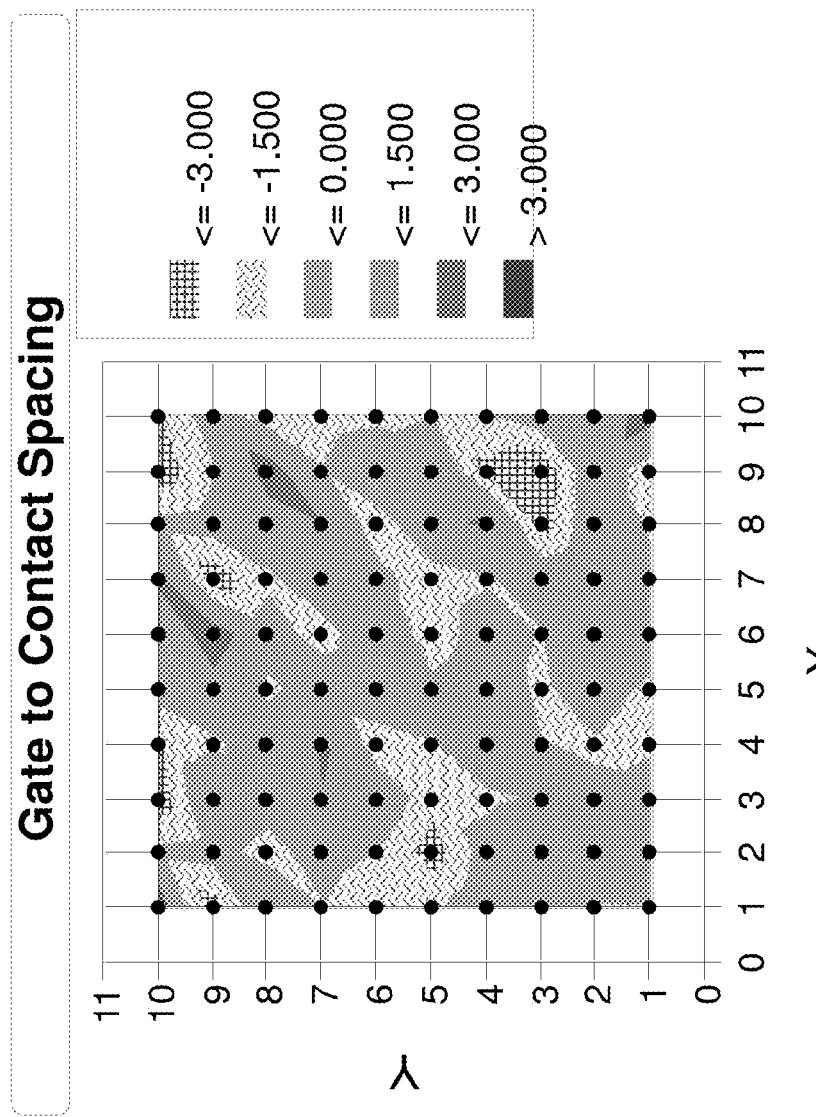
FIG. 4 is a graph illustrating the variance of the gate-to-contact spacing across an integrated circuit chip in accordance with an embodiment.

Referring now to FIG. 4, a graph 400 illustrating the variance of the gate-to-contact spacing across an integrated circuit chip in accordance with an embodiment is shown. As described above with reference to FIGS. 1A, 1B and 1C, the gate-to-contact spacing on the integrated circuit chip can vary across the IC due to variances in the fabrication process. The graph 400 illustrates the variance in the gate-to-contact spacing with zero representing the predetermined, or ideal, spacing and illustrating the spacing ranging from +/−3 nanometers from the predetermined value.

In exemplary embodiments, each of the gate-to-contact reliability monitors are configured to estimate the gate-to-contact reliability by measuring leakage, breakdown voltage, or any other suitable metric. If the monitored leakage is large, the risk of a TDDB failure is high and the operating voltage in that part of the chip may be restricted. Likewise, if the monitored breakdown voltage is small, the risk of a TDDB failure is high and the operating voltage in that part of the chip may be restricted to meet end-of-life TDDB requirements.

Figure 5:
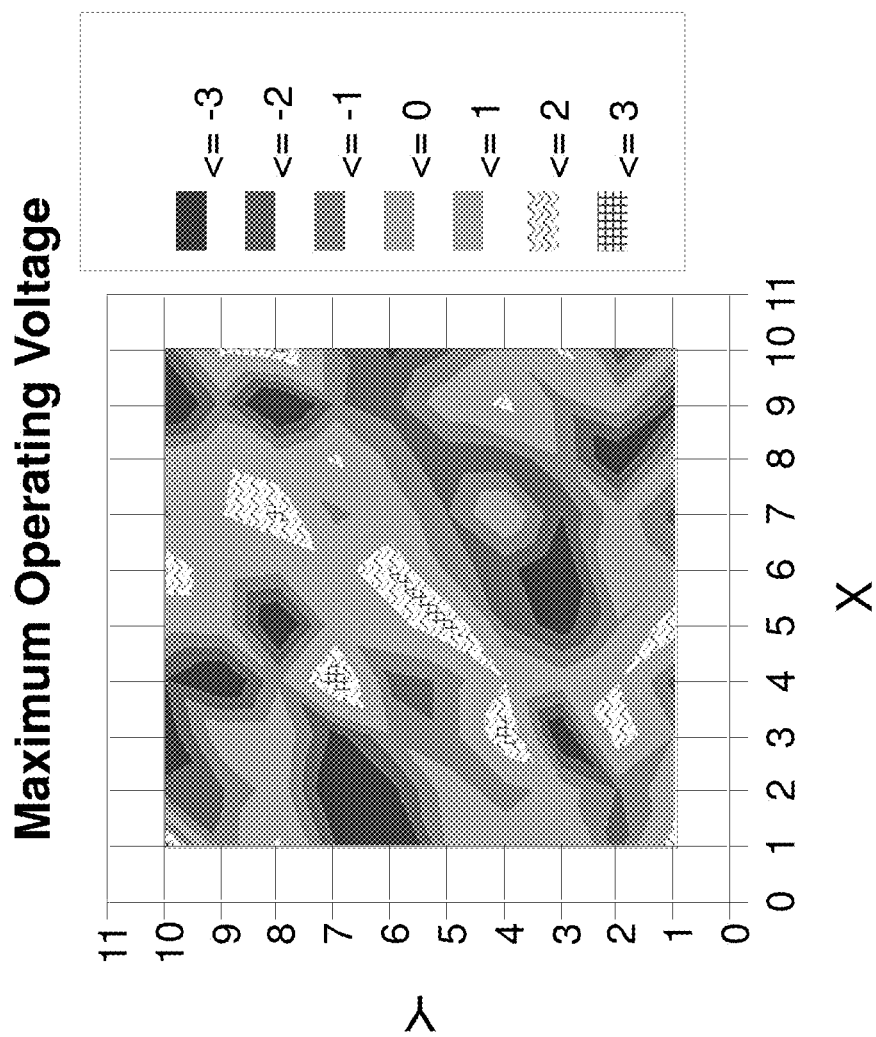
FIG. 5 is a graph illustrating the variance of the maximum operating voltage across an integrated circuit chip in accordance with an embodiment.

In exemplary embodiments, the information received from the gate-to-contact reliability monitors can be used to set the operating voltage at different levels in that part of the chip. By determining and setting local maximum operating voltages based on the local chip characteristics, local dynamic voltage scaling can be used to increase performance and prevent TDDB failures from occurring. For applications where performance is critical, IC chips may be screened which do not meet maximum voltage criterion to prevent failures. As shown in FIG. 5, the maximum operating voltage can vary across an integrated circuit chip based on the information received from the gate-to-contact reliability monitors. Maximum operating voltage range is shown in arbitrary units from the predetermined value.

Figure 6A:
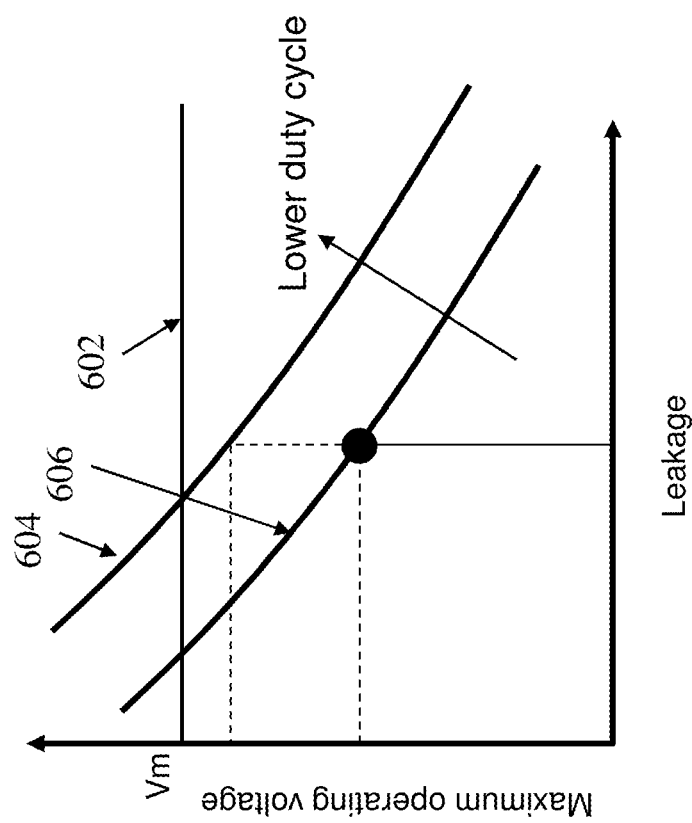
FIG. 6A is a graph illustrating the maximum operating voltage for a MOSFET as a function of the leakage of the gate-to-contact reliability monitor in accordance with an embodiment.

Referring now to FIG. 6A, a graph illustrating the maximum operating voltage for a MOSFET as a function of the leakage of the gate-to-contact reliability monitor in accordance with an embodiment is shown. As illustrated by line 604 and line 606, the maximum operating voltage is inversely related to the leakage of the gate-to-contact reliability monitor. In addition, the maximum operating voltage may depend on the duty cycle of the MOSFET. As shown, line 604 represents the maximum operating voltage for a MOSFET as a function of the leakage with a first duty cycle and line 606 represents the maximum operating voltage for a MOSFET as a function of the leakage with a duty cycle lower than the first duty cycle. Furthermore, the MOSFET includes a fixed maximum operating voltage (Vm) 602, which may be based on power and/or reliability constraints for the entire IC.

Figure 6B:
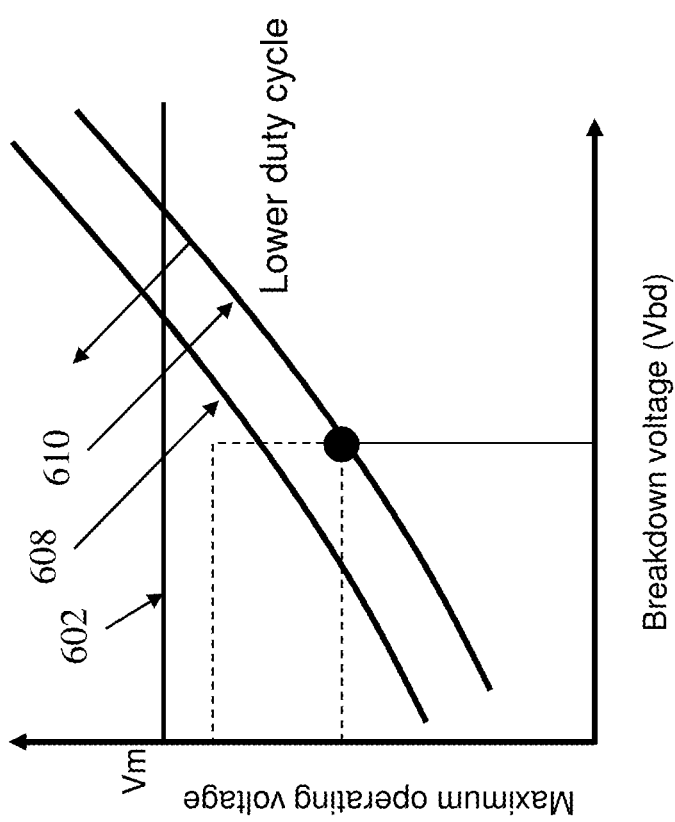
FIG. 6B is a graph illustrating the maximum operating voltage for a MOSFET as a function of the breakdown voltage of the gate-to-contact reliability monitor in accordance with an embodiment.

Referring now to FIG. 6B, a graph illustrating the maximum operating voltage for a MOSFET as a function of the breakdown voltage of the gate-to-contact reliability monitor in accordance with an embodiment is shown. As illustrated by line 608 and line 610, the maximum operating voltage is directly related to the breakdown voltage of the gate-to-contact reliability monitor. In addition, the maximum operating voltage may depend on the duty cycle of the MOSFET. As shown, line 608 represents the maximum operating voltage for a MOSFET as a function of the leakage with a first duty cycle and line 610 represents the maximum operating voltage for a MOSFET as a function of the leakage with a duty cycle lower than the first duty cycle. Furthermore, the MOSFET includes a fixed maximum operating voltage (Vm) 602, which may be based on power and/or reliability constraints for the entire IC.

In exemplary embodiments, if the breakdown voltage is used for determining the maximum operating voltage, voltage information can be stored in a memory device, such as a ROM. In exemplary embodiments, if the leakage is used for determining the maximum operating voltage, measurement of the leakage can be done at power-up or during operation of the IC.

Figure 7:
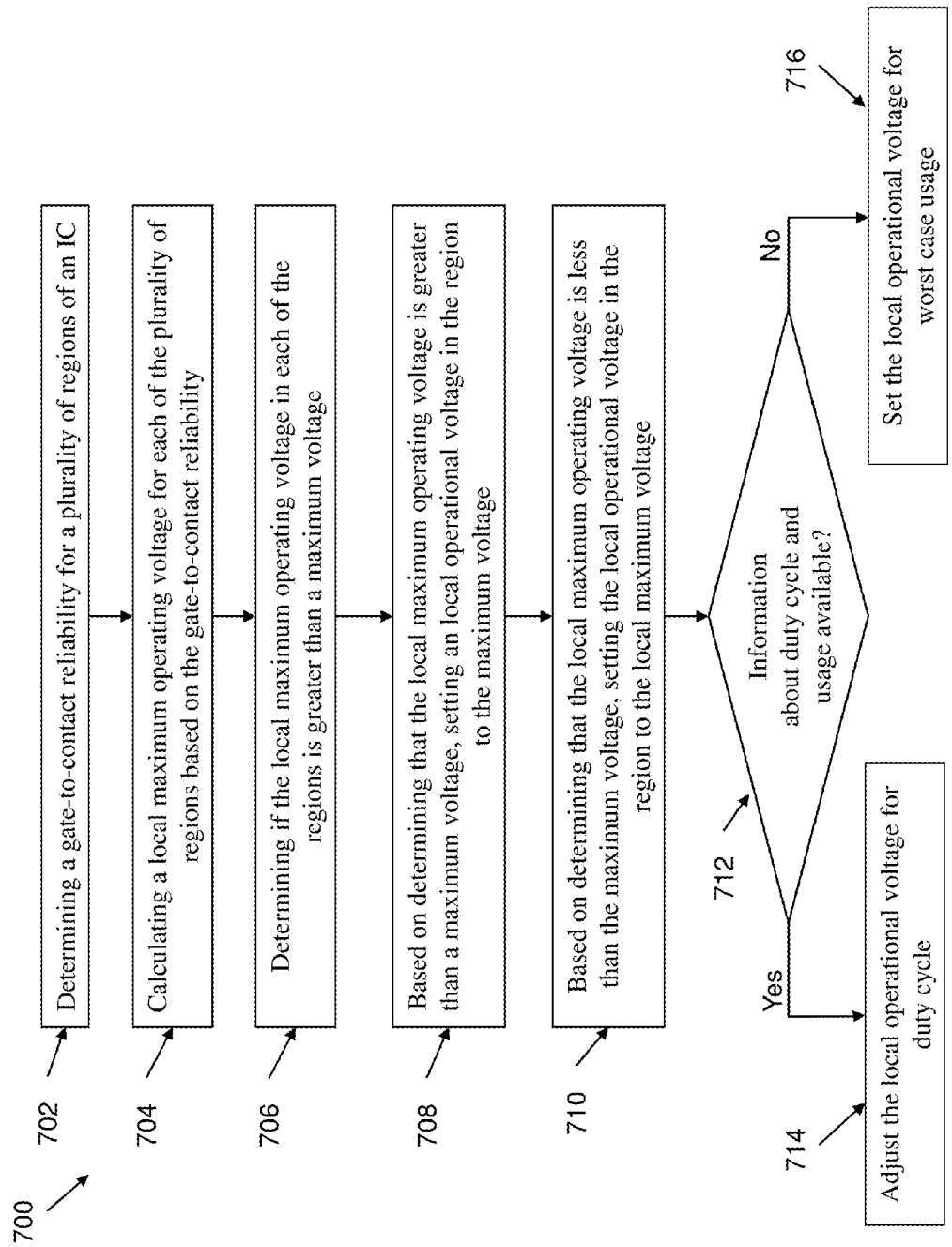
FIG. 7 is a flow diagram of a method for providing a local maximum operating voltage on an integrated circuit in accordance with an embodiment.

Referring now to FIG. 7, a flow chart illustrating a method 700 for providing a local maximum operating voltage on an integrated circuit in accordance with an exemplary embodiment is shown. As shown at block 702, the method 700 includes determining a gate-to-contact reliability for a plurality of regions of an integrated circuit. Next, as shown at block 704, the method 700 includes calculating a local maximum operating voltage for each of the plurality of regions based on the gate-to-contact reliability. After the local maximum operating voltage for each of the plurality of regions has been calculated, the method 700 includes determining if the local maximum operating voltage in each of the regions is greater than a maximum voltage, as shown at block 706. In exemplary embodiments, the maximum voltage may be a maximum voltage for the entire IC and may be based on other power and/or reliability constraints. Based on determining that the local maximum operating voltage is greater than a maximum voltage, the method 700 includes setting a local operational voltage in the region to the maximum voltage, as shown at block 708. Based on determining that the local maximum operating voltage is less than the maximum voltage, the method 700 includes setting the local operational voltage in the region to the local maximum voltage, as shown at block 710. Next, as shown at decision block 712, the method 700 includes determining if information about a duty cycle and usage for the regions of the IC are available. If information about the duty cycle and usage for the regions of the IC are available, the method 700 includes adjust the local operational voltage for duty cycle and usage information, as shown at block 714. If information about the duty cycle and usage for the regions of the IC are not available, the method 700 includes setting the local operational voltage for worst case usage, as shown at block 716.

Figure 8:
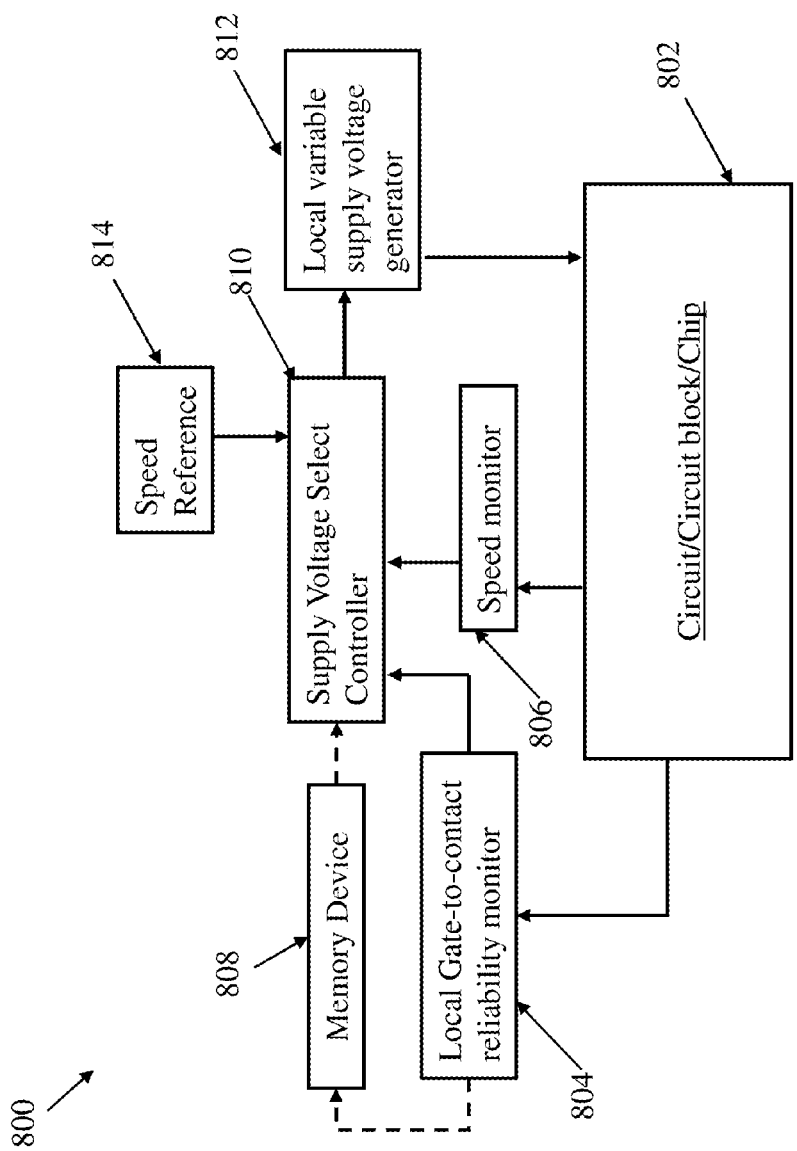
FIG. 8 is a block diagram of a system for providing a local maximum operating voltage on an integrated circuit in accordance with an embodiment.

Referring now to FIG. 8, a block diagram illustrating a system 800 for providing a local maximum operating voltage on an integrated circuit 802 in accordance with an exemplary embodiment is shown. As illustrated the system 800 includes an integrated circuit 802, a local gate-to-contact reliability monitor 804 and a speed monitor 806. The local gate-to-contact reliability monitor 804 and the speed monitor 806 both are configured to monitor operational characteristics of the integrated circuit 802 and to provide the monitored operational characteristics to a supply voltage select controller 810. In addition to the monitored operational characteristics the supply voltage select controller 810 may receive stored data from a memory device 808 and speed reference data 814. In exemplary embodiments, the memory device 808 may be used to store voltage information received from the local gate-to-contact reliability monitor 804. In exemplary embodiments, the supply voltage select controller 810 is configured to determine a local maximum operating voltage for various regions of the integrated circuit 802 and to provide the local maximum operating voltages to the local variable supply generator 812, which generates the various local maximum operating voltages and provides the various local maximum operating voltages to the proper regions of the integrated circuit 802.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for providing a local maximum operating voltage for each of a plurality of regions of an integrated circuit, the method comprising:
   receiving an operation characteristic from a gate-to-contact reliability monitor for each of the plurality of regions;
   calculating, by using a computer, a local maximum voltage for each of the plurality of regions based on the operational characteristic;
   based on a determination that the local maximum voltage in one of the plurality of regions is greater than a maximum voltage, setting the local maximum operating voltage to the maximum voltage;
   based on a determination that the local maximum voltage in one of the plurality of regions is less than the maximum voltage, setting the local maximum operating voltage to the local maximum voltage; and
   adjusting the local maximum operating voltage based on duty cycle information by increasing the local maximum operating voltage based on a lower than expected duty cycle.

2. The method of claim 1, wherein the operational characteristic is a leakage detected by the gate-to-contact reliability monitor in each of the plurality of regions.

3. The method of claim 1, wherein the operational characteristic is a breakdown voltage measured by the gate-to-contact reliability monitor in each of the plurality of regions.

4. The method of claim 1, wherein when duty cycle information is unavailable the local maximum operating voltage is based on a worst case duty cycle information.

5. A system for providing a local maximum operating voltage, the system comprising:
   an integrated circuit comprising a plurality of regions;
   a plurality of gate-to-contact reliability monitors, wherein at least one of the plurality of gate-to-contact reliability monitors is disposed in each of the plurality of regions;
   a supply voltage select controller configured to:
   receive an operational characteristic from each of the of plurality of gate-to-contact reliability monitors;
   calculate a local maximum voltage for each of the plurality of regions based on the operational characteristic;
   based on a determination that the local maximum voltage in one of the plurality of regions is greater than a maximum voltage, set the local maximum operating voltage to the maximum voltage; and
   based on a determination that the local maximum voltage in one of the plurality of regions is less than the maximum voltage, set the local maximum operating voltage to the local maximum voltage; and
   adjust the local maximum operating voltage based on duty cycle information by performing one of increasing the local maximum operating voltage based on a lower than expected duty cycle or reducing the local maximum operating voltage based on a higher than expected duty cycle.

6. The system of claim 5, wherein operational characteristic is a leakage detected by the gate-to-contact reliability monitor in each of the plurality of regions.

7. The system of claim 5, wherein operational characteristic is a breakdown voltage measured by the gate-to-contact reliability monitor in each of the plurality of regions.

8. The system of claim 5, further comprising a local variable supply voltage generator configured to receive the local maximum operating voltage from the supply voltage select controller and to provide the local maximum operating voltage to the integrated circuit.

9. The system of claim 5, further comprising a speed monitor configured to monitor an operational speed of the integrated circuit and to provide the operational speed to the supply voltage select controller.

10. A method for providing a local maximum operating voltage for each of a plurality of regions of an integrated circuit, the method comprising:

receiving an operation characteristic from a gate-to-contact reliability monitor for each of the plurality of regions;

calculating, by using a computer, a local maximum voltage for each of the plurality of regions based on the operational characteristic;

based on a determination that the local maximum voltage in one of the plurality of regions is greater than a maximum voltage, setting the local maximum operating voltage to the maximum voltage;

based on a determination that the local maximum voltage in one of the plurality of regions is less than the maximum voltage, setting the local maximum operating voltage to the local maximum voltage; and adjusting the local maximum operating voltage based on duty cycle information by reducing the local maximum operating voltage based on a higher than expected duty cycle.

11. The method of claim 10, wherein the operational characteristic is a leakage detected by the gate-to-contact reliability monitor in each of the plurality of regions.

12. The method of claim 10, wherein the operational characteristic is a breakdown voltage measured by the gate-to-contact reliability monitor in each of the plurality of regions.

13. The method of claim 10, wherein when duty cycle information is unavailable the local maximum operating voltage is based on a worst case duty cycle information.

\* \* \* \* \*